United States Patent [19]
Ertl et al.

[11] 4,369,376
[45] Jan. 18, 1983

[54] MAGNETIC GATE AND METHOD OF PRODUCTION THEREOF

[75] Inventors: Wilhelm Ertl, Ottobrunn; Ulrich Lachmann; Heinrich Pertsch, both of Munich; Günter Wirnharter, Brannenburg, all of Fed. Rep. of Germany

[73] Assignee: Siemens Aktiengesellschaft, Berlin and Munich, Fed. Rep. of Germany

[21] Appl. No.: 225,615

[22] Filed: Jan. 16, 1981

[30] Foreign Application Priority Data

Jan. 18, 1980 [DE] Fed. Rep. of Germany ....... 3001820

[51] Int. Cl.³ .......................................... G01R 33/12
[52] U.S. Cl. .................................... 307/99; 307/278; 307/309; 174/52 PE; 338/32 H
[58] Field of Search ............ 338/32 H; 307/278, 309, 307/98, 99, 116; 324/251, 252; 174/52 PE

[56] References Cited
U.S. PATENT DOCUMENTS 3,845,445 10/1974 Braun et al. ..................... 338/32 H
4,086,533 4/1978 Ricovard et al. ............ 338/32 H X
4,112,408 9/1978 Roozenbeek ..................... 338/32 H
4,204,158 5/1980 Ricovard et al. ............ 338/32 H X Primary Examiner—G. Z. Rubinson
Assistant Examiner—James L. Dwyer
Attorney, Agent, or Firm—Herbert L. Lerner; Laurence A. Greenberg

[57] ABSTRACT

Magnetic gate, including a magnet having two poles, one of the poles having an at least partly flat surfaces, a magnetically permeable metal piece bridging the magnetic flux of the magnet from one to the other of the poles, and a semiconductor chip having an integrated circuit, the semiconductor chip being piezoelectrically unsensitive and being applied to the permeable metal piece, and method of production thereof.

5 Claims, 1 Drawing Figure

U.S. Patent  Jan. 18, 1983  4,369,376
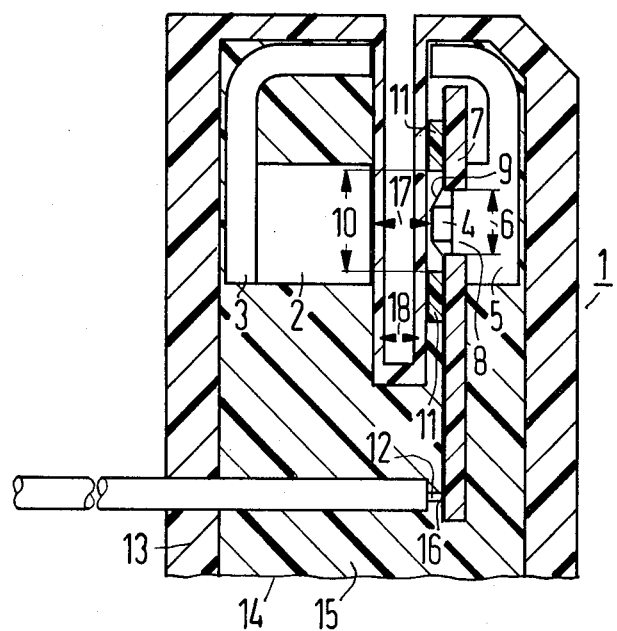

MAGNETIC GATE AND METHOD OF PRODUCTION THEREOF

The invention relates to a magnetic gate formed, on one hand, of a magnet having one magnetic pole shaped in such a way that at least a part of its surface is flat, and, on the other hand, formed of a semiconductor chip which is provided with an integrated circuit, and a magnetically permeable metal piece which conducts the magnetic flux to the other pole. It had been tried in the past to produce magnetic gates of the hereinafore-described type by applying a silicon chip having an integrated circuit onto a ceramic substrate by means of so-called flip-chip-technology, i.e. by means of soft bumps or raised areas, and to cap it with a cover. Conductive circuits are provided on the ceramic substrate which lead to the bumps of the silicon chip, and which are provided at the edges of the ceramic substrate with soldered connecting wires. A magnet and the silicon chip are assembled into a prefabricated housing in such a manner that a flat portion of a magnetic pole runs parallel to the two largest surface portions of the silicon chip, and that the silicon chip is disposed at the same height as the parallel magnetic-pole surface area. Furthermore, a magnetically permeable metal piece for the magnetic flux is placed into the prefabricated housing disposed opposite to the cover of the silicon chip, and is provided there with a raised portion. The magnet used is formed of Alnico. The housing which is used is provided with side slits which are parallel to the ceramic substrate plate. During the subsequent potting operation with plastic, these salts must be covered, which creates technical difficulties, and requires additional work effort. Using a ceramic plate which also forms a part of the surface of the outer housing wall and is connected by the plastic cast with the rest of the housing, frequently forms cracks at the connecting regions due to the different thermal expansion coefficients of the various materials used, so that such magnetic gates have no reliable corrosion protection.

Finally, using a ceramic plate of 0.6 mm thickness in the described way leads to a relatively large gap-width which results in a deterioration of the magnetic circuit.

Magnetic gates of the hereinafore-described type have a number of disadvantages. They have poor mechanical strength. Furthermore, the positioning of the ceramic substrate is unreliable, i.e. of the silicon chip with respect to the magnet and the magnetically conducting metal as well. This results in faulty fluctuations of the magnetic flux in the silicon chip causing defective functioning of the magnetic gate. By using the hereinafore-described construction, the gap between the magnetic pole, on the one hand, and the silicon chip, on the other hand, is wide, approximately 3 mm, and also the gap between the silicon chip and the magnetically permeable metal piece is large, approximately 0.8 mm. These large gap-widths cause a low magnetic flux. In order to obtain sufficient, stable magnetic flux, especially when using Alnico magnets, the magnet used must be correspondingly large. Large gap width and large magnets result in a certain minimum size of the magnetic gates produced by this method. However, in certain applications, large magnetic gates can be used only accepting disadvantages, or they are not applicable at all.

Furthermore, the use of ceramic substrate entails disadvantages in the manufacturing process besides a low reliability against shock and breakage. The work required to manufacture the device using ceramic substrates is considerable. Most of all, the use of ceramic substrates makes the automation of the manufacturing process of magnetic gates thus produced practically impossible. To this must be added the fact that the magnetic field strength of Alnico magnets is not constant over longer time periods, so that magnetic gates made according to this process become nonfunctional after a certain time.

It is accordingly an object of the invention to provide a magnetic gate and method of production thereof which overcomes the hereinafore-mentioned disadvantages of the heretofore-known devices and methods of this general type, and which at the same time has a small size, and high mechanical strength as well as high functional reliability which is constant over long time periods.

With the foregoing and other objects in view there is provided, in accordance with the invention, a magnetic gate, comprising a magnet having two poles, one of the poles having an at least partly flat surface, a magnetically permeable metal pieces bridging flux of the magnet from one to the other of the poles, and a semiconductor chip having an integrated circuit, the semiconductor chip being piezo-electrically unsensitive and being applied to the permeable metal piece.

Through the use of piezo-insensitive semiconductor chips it becomes possible to apply them to an associated magnetically permeable metal piece. With this measure, the gap between the semiconductor chip and the magnetic pole opposite it can be minimized, as can the gap between the semiconductor chip and the magnetically conducting metal piece. Minimizing the gap results in a corresponding miniaturization of the magnets used with the magnetic-flux, and thus leads to a miniaturization of the magnetic gates made according to this method.

In accordance with another feature of the invention, the magnet is a samarium-cobalt magnet. The field strength of samarium-cobald magnets is greater and more constant with respect to time than conventionally-used magnets of the same size, such as Alnico magnets or those of other ferro-magnetic materials. This permits further miniaturization in an advantageous way and provides improved quality of the magnetic gates produced accordingly.

In accordance with a further feature of the invention, there is provided a thin intermediate carrier formed of a synthetic band, for example, having a cutout formed therein and electrical connections, a carrier plate having a cutout formed therein and electrical connections, the semiconductor chip being disposed in the cutouts formed in the intermediate carrier and carrier plate and having electrical connections, and finger-like contact structures connecting the electrical connections of the semiconductor chip and the intermediate carrier together, the electrical connections of the intermediate carrier and the carrier plate being connected to each other, the semiconductor chip being disposed directly on a part of the magnetically permeable metal piece and the magnetic flux being unweakened by the carrier plate at the cutouts.

By this measure, the magnetic flow or flux of a magnetic gate according to the invention can be strengthened under otherwise equal conditions. On the other hand, if a certain magnetic flux is predetermined, the size of the magnet used can be reduced by this measure, so that a further miniaturization of magnetic gates is accomplished through the use of this measure.

In accordance with an additional feature of the invention, the semiconductor chip is spaced from one of the magnetic poles of the magnet defining an air gap therebetween, the air gap being between 1 and 4 mm wide, in particular with a spacing of 2 to 3 mm. A good dissipation of the heat generated in the semiconductor chip is often critial for the usability of certain components in specific applications. Because magnetic gates must function faultlessly at operating temperatures of 150° C. in various applications, the dissipation of heat is a prerequisite for the usability of the magnetic gates according to the invention.

Therefore, in accordance with an added feature of the invention, the magnetically permeable metal piece is heat conducting for carrying away heat generated in the semiconductor chip.

In accordance with yet another feature of the invention, there is provided a housing having an open rear surface, the housing being closed except for said rear surface. This type of housing has the advantage that, when the housing is later filled with a suitable potting compound, such as a synthetic material, the component is completely sealed in a single work operation. The component is thereby optimally protected against corrosion, which is of special importance for the application in motor vehicles, for example, particularly considering the use of salt-spreading during the winter months.

In accordance with a concomitant mode of the invention, there is provided a method which comprises soldering the semiconductor chip as a miniaturized package or micro-pack to the intermediate carrier with the finger-like structures, applying the carrier plate to the magnetically permeable metal piece, assembling the intermediate carrier to the carrier plate with the semiconductor chip disposed in the cutout formed in the carrier plate, soldering the electrical connections of the intermediate carrier and the carrier plate to each other, connecting the external lead wires to the electrical connections of the carrier plate, separately introducing the magnet with a first part of the magnetically permeable metal piece, and a second part of the magnetically permeable metal piece with the carrier plate and the intermediate carrier and the semiconductor chip into the housing, and filling the interior space of the housing with a poured insulator formed of synthetic material, for example, covering the connecting points between the external wire leads and the electrical connections of the carrier plate.

The method has the advantage that the component is already functional before filling with the potting compound, so that in this state various control measurements can be made, and defective or faulty assembled parts can already be detected and exchanged at this time, thus keeping low the loss caused by components that have to be scrapped. This advantage is especially important in consideration of the use of the very expensive samarium-cobalt magnets. Furthermore, by the use of this manufacturing method, when using suitable potting compounds, operational steps can be omitted. For example, the cementing of the semiconductor chips, and possibly of the carrier plate to the second part of the magnetically permeable metal piece can be dispensed with because a suitable potting compound can replace the adhesive. However, with this method the semiconductor chip already can be bonded to the magnetically permeable metal piece by means of a suitable cement before potting. A further advantage can also be seen in the possibility of automating the manufacturing method.

Other features which are considered as characteristic for the invention are set forth in the appended claims.

Although the invention is illustrated and described herein as embodied in magnetic gate and method of production thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing, which is a fragmentary diagrammatic cross-sectional view of a Hall-magnetic gate according to the invention.

Referring now particularly to the FIGURE of the drawing, it is seen that the Hall-magnetic gate 1 includes a magnet 2, formed of Samarium-cobalt, for example, which is cemented to a first part 3 of a magnetically permeable metal member, and a semiconductor chip 4 which is provided with an integrated circuit, that is attached to a second part 5 of a magnetically permeable metal member. The second part 5 of the permeable metal member, such as soft iron, is formed with a portion 8 that extends into a cutout 6 formed in a carrier plate 7. The semiconductor chip 4 lies directly on the portion 8 of the magnetically permeable metal piece. The semiconductor chip 4 is connected to an intermediate carrier or mask 11 by means of finger-like structures 9, so that the semiconductor chip 4 is disposed within a cutout 10 formed in the intermediate carrier 11. The finger-like structure 9 connect the electrical contacts of the chip 4 with the contacts of the intermediate carrier 11, which lie in the plane between the intermediate carrier 11 and the carrier plate 7, and are not shown in the drawing. In turn, the electrical contacts of the intermediate carrier 11 are conductively connected with the electrical contacts of the carrier plate 7. The contact structure of the carrier plate 7 are provided with external connecting wires or leads 12 which are electrically insulated and lead from the element to the outside. The housing 13 is enclosed on all sides with the exception of a surface 14. The inside is filled with an insulating material such as a synthetic plastic, in such a manner that it covers the connecting points 16 between the external connecting wires 12 and the carrier plate 7. The gap 17 between the magnet 2 and the semiconductor chip 4 is approximately 1 mm to 4 mm, and in particular 2 mm to 3 mm. A ferromagnetic plate which is not shown in the drawing, is provided with cutouts, turns in the housing-gap 18, and opens and closes the Hall-magnetic gate according to the invention.

During the assembly of the magnetic gate according to the invention, the magnet 2 is connected with the first part 3 of the magnetically permeable metal piece by cementing, for example, and is installed in the housing 13; the second part 5 of the magnetically permeable metal piece is first provided with the carrier plate 7, and then assembled with the intermediate carrier plate 11 in such a manner that the semiconductor chip 4 is glued on only initially pressed-in onto the part 8 of the second part 5 of the magnetically permeable metal piece, and the electrical connections of the intermediate carrier 11 are soldered to the electrical connectors of the carrier plate 7. The carrier plate 7 is provided with the external wires 12. In this state, the second part 5 of the magnetically permeable metal piece is placed into the housing 13. The thus assembled component is already operative, so that, for example, to avoid the production of low quality devices, measurements can be made. Then the housing interior 15 is filled with a suitable potting material, so that even the connecting points 16 between the external connecting wires 12 and the carrier plate 7 are covered by the potting material. In the case when the semiconductor chip 4 has only been pressed onto the part 8 of the magnetically permeable metal piece, the potting material also serves for cementing the semiconductor chip 4 to the part 8.

The housing is made of poly-butylenterephtalate, for example. For miniaturization of the magnetic gate according to the invention, the magnet 2 can be made of samarium-cobalt, but is by no means limited to this material. It can rather be formed of other ferromagnetic materials, such as Alnico. The magnetically permeable metal pieces 3 and 5 can be formed of iron of type RFE 120. However, they are not necessarily made from this material. Any other ferromagnetic material can be used which has sufficient thermal conductivity so that the heat generated in the semiconductor chip 4 is sufficiently conducted away. The carrier plate is formed, for example, of copper-clad epoxy-fiberglas. However, it is not limited to this material, but can also be made of a hard paper or insulation. The semiconductor chip can, for example, be made of silicon, but is also not limited to this material. The intermediate carrier 11 can be made as a band of synthetic material, for example Kapton. However, it is not limited to this material.

An epoxy casting compound and/or epoxy-cement is, for example, suitable as the potting compound for the housing interior 15. However, also other materials may be used.

For manufacturing purposes, it has proven itself to be especially advantageous to make the part 8 of the magnetically permeable metal piece with several steps, as shown in the drawing, so that the carrier plate 7 can be fitted to it without complicated cementing, and the solder connections of the intermediate carrier 11 can be soldered to the associated connections of the carrier plate 7, so that the semiconductor chip 4 lies directly on the part 8 of the magnetically permeable metal piece. The cementing of the semiconductor chip 4 to the part 8 is not necessary before installation of the parts in the housing, because these parts are automatically cemented by the potting of the housing interior. However, if for technical reasons it is required to cement the semiconductor chip to the part 8, this cementing operation can be performed before potting. Magnetic gates according to the invention are being used as position sensors with respect to translatory and rotatory motions, such as for machine tools as end-position switches, or for belt assembly lines to control the advance of the belt.

Magnetic gates according to the invention can also be used for interrogation of coded parameters through the combination of several magnetic gates.

Finally, they can be used as non-contacting switches.

There are claimed:

1. Magnetic gate, comprising a housing, a magnet being disposed in said housing and having two poles, one of said poles having an at least partly flat surface, a magnetically permeable metal piece bridging the magnetic flux of said magnet from one to the other of said poles and having a first part to which said magnet is directly applied, and a second part having an extended portion, a semiconductor chip having an integrated circuit, said semiconductor chip being piezo-electrically unsensitive and being applied directly to said extended portion of said second part of said permeable metal piece and spaced from one of said magnetic poles of said magnet defining an air gap therebetween, a thin intermediate carrier having a cutout formed therein and electrical connections, a carrier plate having a cutout formed therein and electrical connections, said extended portion of said second part of said permeable metal piece being disposed in said cutout formed in said carrier plate, said semiconductor chip being disposed in said cutouts formed in said intermediate carrier and carrier plate and having electrical connections, finger-like contact structures connecting said electrical connections of said semiconductor chip and said intermediate carrier together, said electrical connections of said intermediate carrier and said carrier plate being connected to each other, additional external connecting wires extending from connecting points at said carrier plate to a location outside said housing, and insulating material filling said housing and covering said connecting points, the magnetic flux being unweakened by said carrier plate at said cutouts, and said housing having a gap formed therein in said insulating material between said first and second parts of said permeable metal piece including said air gaps.

2. Magnetic gate according to claim 1, wherein said magnet is a samarium-cobalt magnet.

3. Magnetic gate according to claim 1, wherein said air gap is between 1 and 4 mm wide.

4. Magnetic gate according to claim 1, wherein said magnetically permeable metal piece is heat conducting for carrying away heat generated in said semiconductor chip.

5. Magnetic gate according to claim 1, wherein said housing has an open rear surface, said housing being closed except for said rear surface.

* * * * *